United States Patent
Lotz

(10) Patent No.: US 7,332,429 B2
(45) Date of Patent: Feb. 19, 2008

(54) LASER ABLATION AND IMPRINTING HYBRID PROCESSING FOR FABRICATION OF HIGH DENSITY INTERCONNECT FLIP CHIP SUBSTRATES

(75) Inventor: Stefanie M. Lotz, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/319,997

(22) Filed: Dec. 27, 2005

(65) Prior Publication Data

US 2007/0158854 A1 Jul. 12, 2007

(51) Int. Cl.
*H01L 21/44* (2006.01)

(52) U.S. Cl. .................................. 438/652; 438/629

(58) Field of Classification Search ............... 257/777, 257/774, 778; 438/652, 629, 637, 639, 640, 438/667, 668, 672, 675, 700, 701, 713
See application file for complete search history.

(56) References Cited

U.S. PATENT DOCUMENTS

| | | | | |
|---|---|---|---|---|
| 5,233,157 A | * | 8/1993 | Schreiber et al. | 219/121.68 |
| 5,378,313 A | * | 1/1995 | Pace | 216/20 |
| 6,631,558 B2 | * | 10/2003 | Burgess | 29/852 |
| 2006/0046461 A1 | * | 3/2006 | Benson et al. | 438/612 |

* cited by examiner

*Primary Examiner*—Roy Potter
(74) *Attorney, Agent, or Firm*—David L. Guglielmi

(57) ABSTRACT

In some embodiments, laser ablation and imprinting hybrid processing for fabrication of high density interconnect flip chip substrates are presented. In this regard, a substrate in introduced having a dielectric layer wherein material has been removed from a surface and the cavity has been plated with conductive material resulting in a feature width of less than about 10 micrometers. Other embodiments are also disclosed and claimed.

4 Claims, 2 Drawing Sheets

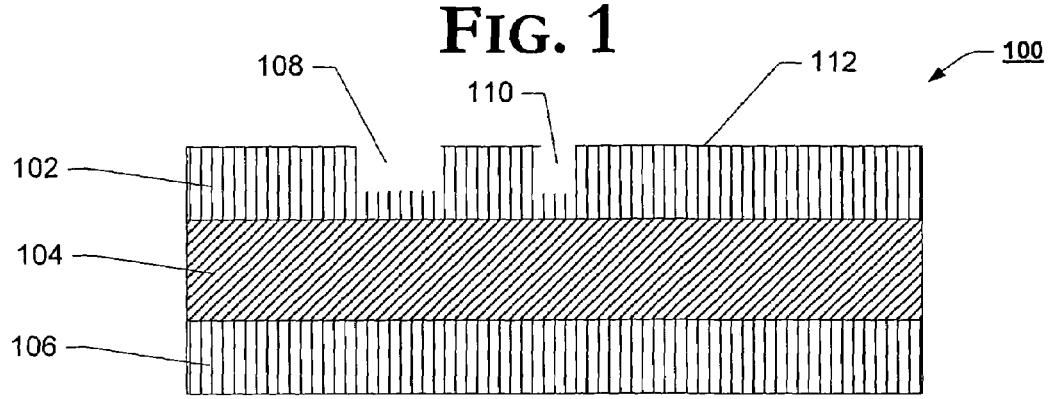
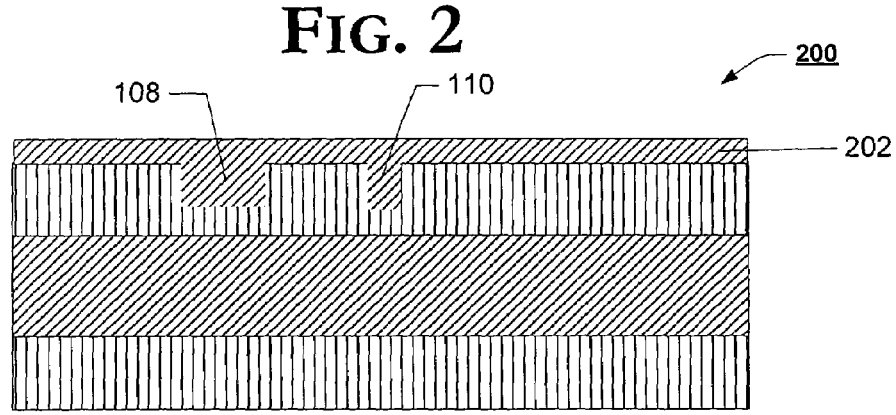
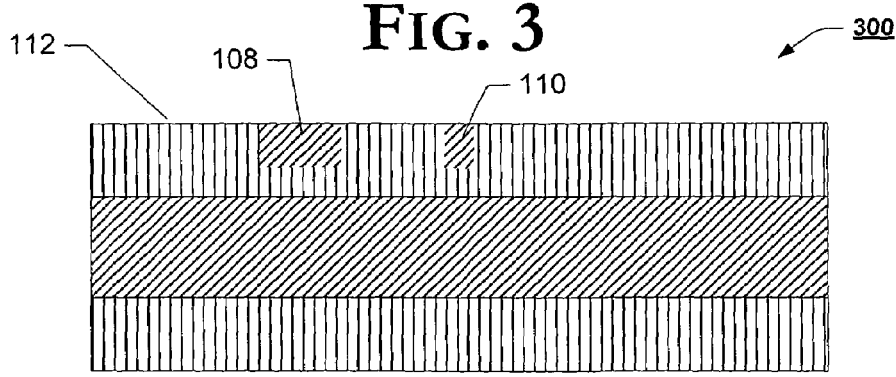

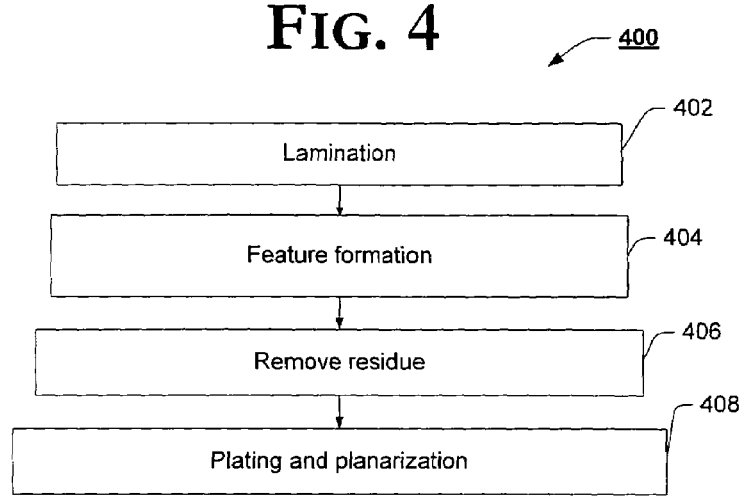
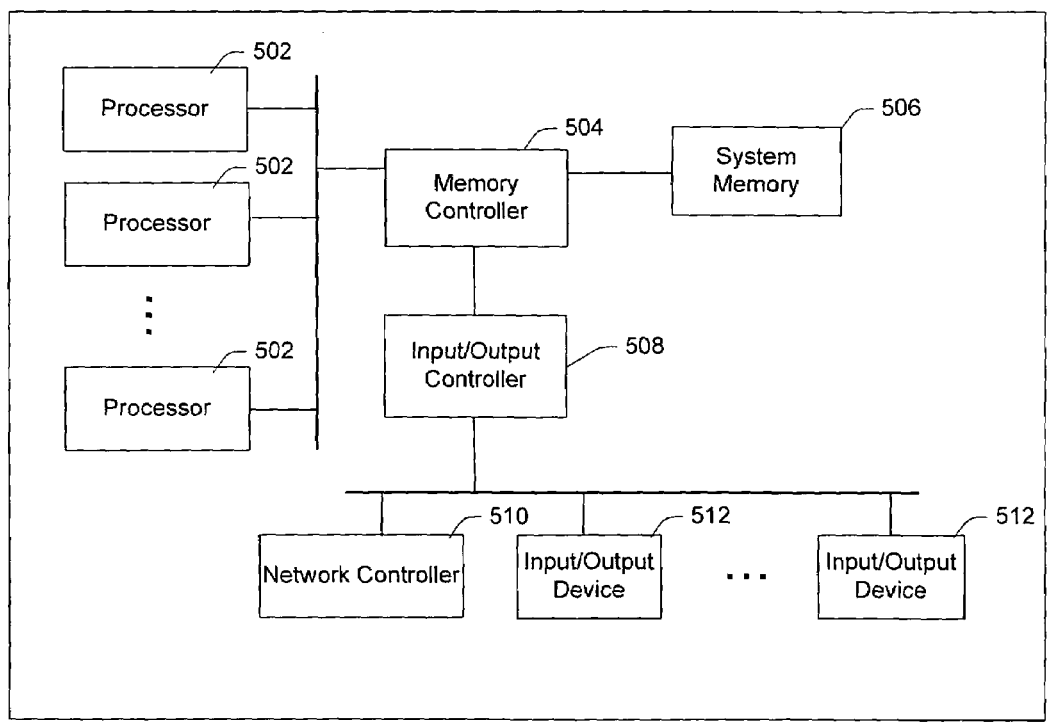

LASER ABLATION AND IMPRINTING HYBRID PROCESSING FOR FABRICATION OF HIGH DENSITY INTERCONNECT FLIP CHIP SUBSTRATES

FIELD OF THE INVENTION

Embodiments of the present invention generally relate to the field of integrated circuit packages, and, more particularly to a laser ablation and imprinting hybrid processing for fabrication of high density interconnect flip chip substrates.

BACKGROUND OF THE INVENTION

The demand for enhanced performance and body size reduction of integrated circuit components continues to increase design and fabrication complexity due to the higher bandwidth requirements needed to enable higher clock frequencies. The substrates designed for these components will need to be manufactured with even smaller feature sizes to enable optimization of bandwidth.

BRIEF DESCRIPTION OF THE DRAWINGS

The present invention is illustrated by way of example and not limitation in the figures of the accompanying drawings in which like references indicate similar elements, and in which:

FIG. 1 is a graphical illustration of a cross-sectional view of a partially formed IC package substrate, in accordance with one example embodiment of the invention;

FIG. 2 is a graphical illustration of a cross-sectional view of a partially formed IC package substrate, in accordance with one example embodiment of the invention;

FIG. 3 is a graphical illustration of a cross-sectional view of a partially formed IC package substrate, in accordance with one example embodiment of the invention;

FIG. 4 is a flow chart of an example method for fabricating a high density interconnect flip chip substrate, in accordance with one example embodiment of the invention; and FIG. 5 is a block diagram of an example electronic appliance suitable for implementing a high density interconnect flip chip substrate, in accordance with one example embodiment of the invention.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a graphical illustration of a cross-sectional view of a partially formed IC package substrate, in accordance with one example embodiment of the invention. In accordance with the illustrated example embodiment, package substrate 100 includes one or more of dielectric layers 102 and 106, core layer 104, cavities 108 and 110, and surface 112.

Dielectric layers 102 and 106 represent material such as epoxy resin that has been added to core layer 104 as part of a build-up process. Although not shown, conductive traces may be routed within and through-holes may be routed through dielectric layers 102 and 106.

Core layer 104 represents a substrate core that may be made of a metal such as copper. Core layer 104 may be laminated with dielectric material as part of a substrate build-up and may have insulated traces routed through it.

Cavities 108 and 110 represent areas where dielectric material has been removed from layer 102 below surface 112. As part of a process of fabricating a high density interconnect flip chip substrate, for example as described in reference to FIG. 4, cavities 108 and 110 may have been created by a hybrid process involving laser ablation and imprinting technology. Cavity 108 is intended to represent a cavity with a line/space geometry of equal to or less than about 10 micrometers that was created through laser ablation. Cavity 110 is intended to represent a cavity with a line/space geometry of greater than about 10 micrometers that was created through imprinting technology.

FIG. 2 is a graphical illustration of a cross-sectional view of a partially formed IC package substrate, in accordance with one example embodiment of the invention. As shown, package substrate 200 includes conductive plating layer 202 which has plated cavities 108 and 110 and surface 112. Conductive plating layer 202 may be a layer of copper.

FIG. 3 is a graphical illustration of a cross-sectional view of a partially formed IC package substrate, in accordance with one example embodiment of the invention. As part of a planarization process, conductive plating layer 202 over surface 112 has been removed, leaving cavities 108 and 110 filled with conductive material.

In one embodiment, package substrate 300 is coupled on surface 112 with an integrated circuit die such as a flip chip silicon die. In another embodiment, surface 112 is laminated with another dielectric layer as part of a continued build-up process.

FIG. 4 is a flow chart of an example method for fabricating a high density interconnect flip chip substrate, in accordance with one example embodiment of the invention. It will be readily apparent to those of ordinary skill in the art that although the following operations may be described as a sequential process, many of the operations may in fact be performed in parallel or concurrently. In addition, the order of the operations may be re-arranged or steps may be repeated without departing from the spirit of embodiments of the invention.

According to but one example implementation, the method of FIG. 4 begins with lamination (402) of dielectric material (for example layer 102) on a core layer (for example layer 104).

Next, feature formation (404) takes place in dielectric layer 102. In one embodiment, imprinting technology is utilized to displace dielectric material, effectively removing from the surface (112) and creating features where the required feature width is greater than about 10 micrometers. Non-imprinted areas may be masked off (appearing as blank areas) on the micro-tool. In one embodiment, nickel plated micro-tools are used to stamp surface 112 to generate patterns and structures in dielectric layer 102. In one embodiment, subsequent to an imprint performed, a release coating is applied by spray coating. In one embodiment, imprinting is done at a temperature of not more than about 170 C. and a pressure of not more than about 2 atm.

In some embodiments, laser ablation is then utilized to pattern dielectric layer 102 where the required feature width is less than about 10 micrometers, for example in the necking regions of the substrate. In one embodiment, a high fluence eximer laser operating at a wavelength of about 248 nm is utilized.

Next, any residue left behind in the feature formation would be removed (406). In one embodiment, plasma etching with tetrafluoromethane or carbon tetrafluoride is used to remove residual dielectric material from cavities 108 and 110.

Lastly, surface 112 and cavities 108 and 110 plated and planarized (408). In one embodiment, a damascene-style process flow would be followed where the features would be plated with copper and a chemical mechanical planarization process would be followed to remove the overplated copper. In one embodiment, planarization includes a high removal rate copper slurry with removal rates of about 15 um/min. Additional steps may be needed to complete the substrate and to couple the substrate with an integrated circuit die.

FIG. 5 is a block diagram of an example electronic appliance suitable for implementing a high density interconnect flip chip substrate, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may be housed in a package including a substrate described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 508 with the other components of electronic appliance 500. In one embodiment, the connection between processor(s) 502 and memory controller 504 may be referred to as a front-side bus. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
   removing dielectric material from a surface of a substrate layer using imprinting technology;
   removing dielectric material from the surface using laser ablation; and
   plating openings below the surface with conductive material.

2. The method of claim 1, further comprising planarizing the surface to remove overplated copper.

3. A method comprising:
   removing dielectric material from a surface of a substrate layer using imprinting technology; and
   removing dielectric material from the surface using laser ablation, wherein the laser ablation comprises ablating with a high fluence eximer laser operating at a wavelength of about 248 nm.

4. A method comprising:
   removing dielectric material from a surface of a substrate layer using imprinting technology; and
   removing dielectric material from the surface using laser ablation, wherein the laser ablation to provide a feature width of less than about 10 micrometers.

* * * * *